United States Patent [19]

Kirby et al.

[11] 4,087,702
[45] May 2, 1978

[54] DIGITAL ELECTRONIC DIMMER

[76] Inventors: James P. Kirby, 502 S. Park Dr., Austin, Tex. 78704; Peggy D. Dudley, Rte. 1, Box 290, Scappoose, Oreg. 97056; David A. Schwendner, 819 S. Euclid, Oak Park, Ill. 60304

[21] Appl. No.: 665,293

[22] Filed: Mar. 9, 1976

[51] Int. Cl.² ............................................. H03K 17/56
[52] U.S. Cl. ........................... 307/252 B; 307/252 H; 307/308; 315/194; 315/DIG. 4
[58] Field of Search ............................. 315/291–293, 315/194, 199, DIG. 4, DIG. 7; 307/116, 308, 252 B, 252 H; 317/DIG. 2; 328/5; 340/258 C, 365 C

[56] References Cited

U.S. PATENT DOCUMENTS

| | | | |
|---|---|---|---|
| 3,784,848 | 1/1974 | Hamilton | 307/308 |
| 3,805,096 | 4/1974 | Hamilton | 315/292 X |
| 3,811,054 | 5/1974 | Wern et al. | 328/5 X |

*Primary Examiner*—Eugene R. La Roche

[57] ABSTRACT

Disclosed is a lamp-dimmer which employs a novel circuit to provide a digitally selected and phase-shifted trigger-impulse for firing a triac.

21 Claims, 3 Drawing Figures

DIGITAL ELECTRONIC DIMMER

A dimmer of this sort is described in German Invention Disclosure DT-OS 2 017 916. This circuit has the disadvantage that brightness can be controlled only by means of a computer and the relatively complicated programming that it entails. Furthermore, this circuit uses unnecessary and costly analog devices for developing the trigger impulse. Moreover, the brightness can be controlled from only one location, namely, that of the computer. Dimmers in current production utilize a triac fired by an RC-phase-shift-circuit containing a potentiometer. Operation without moving parts, paralleling of dimmer control-inputs, and incorporation of a simple switch-off delay option are not possible.

The novel device described herein utilizes an integrated-circuit capable of being operated by a touch-control in order to produce a digitally selected and phase-shifted trigger-impulse for firing the triac. It overcomes the disadvantages cited in the above paragraph, needs no moving parts, and can be made small enough by means of MOS-integrated-circuit technology that it could easily fit inside the wall-mounted recessed switch-boxes of homes and offices. With well known modifications in the triac-circuitry, the dimmer could also be used as a motor-speed-control for reactive loads.

The circuit-function will be described with reference to three drawings.

Figure 1:
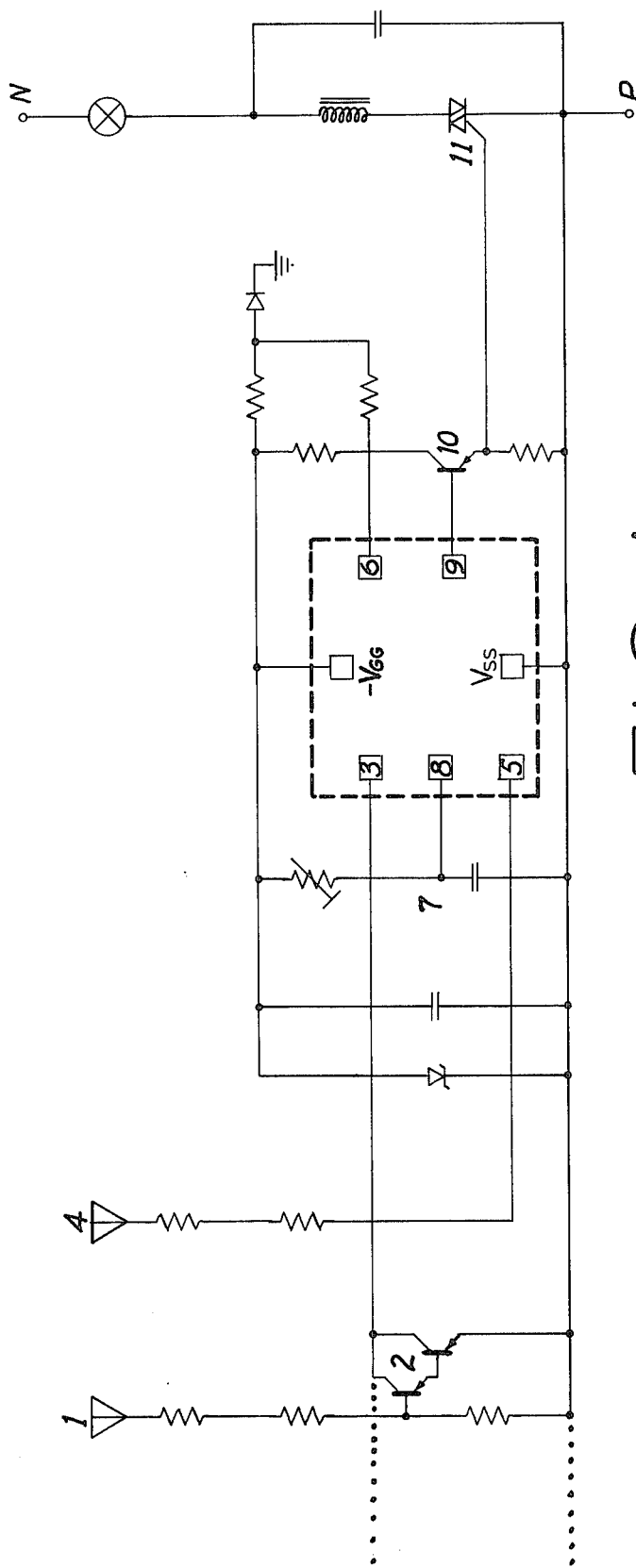
FIG. 1 shows the complete dimmer-circuit wired for touch-control operation.

A finger-tap on the touch-plate 1 of FIG. 1 causes the Darlington-transistor 2 to conduct during a half-cycle of the line-voltage, and a 60 Hz square-wave signal is applied to the discriminator-input over pin 3. The dotted lines show where additional touch-controls, each consisting of a touch-plate, three resistors and a Darlington-transistor, can be attached for parallel operation of the dimmer-circuit. (A simple SPST switch can also operate the dimmer by shorting the dotted lines together.) Provision is also made for operating the dimmer over touch-plate 4, avoiding the need to use a Darlington-transistor. In this alternative, which is not well-suited to noise-free parallel-input operation, the touch-plate feeds directly, without intervening amplification, into the specially designed, high-impedance MOS-input 5.

Over input 6 is fed the line-voltage, from which a datum-point for initiating the counting-process of the internal phase-shift counter is derived. The RC-circuit 7 at the oscillator input 8 determines the degree of subdivision of each half-period of the line-voltage. Output 9 provides the trigger-impulse to transistor 10, which fires triac 11 at the proper instant within the half-period of the line-voltage. (Output 9 could be made powerful enough to fire the triac directly if designed to occupy a large part of the area of the MOS-chip.) All other components in FIG. 1 are used either in noise-suppression or in the power-supply circuitry for the MOS-chip represented by the dashed block.

Figure 2:
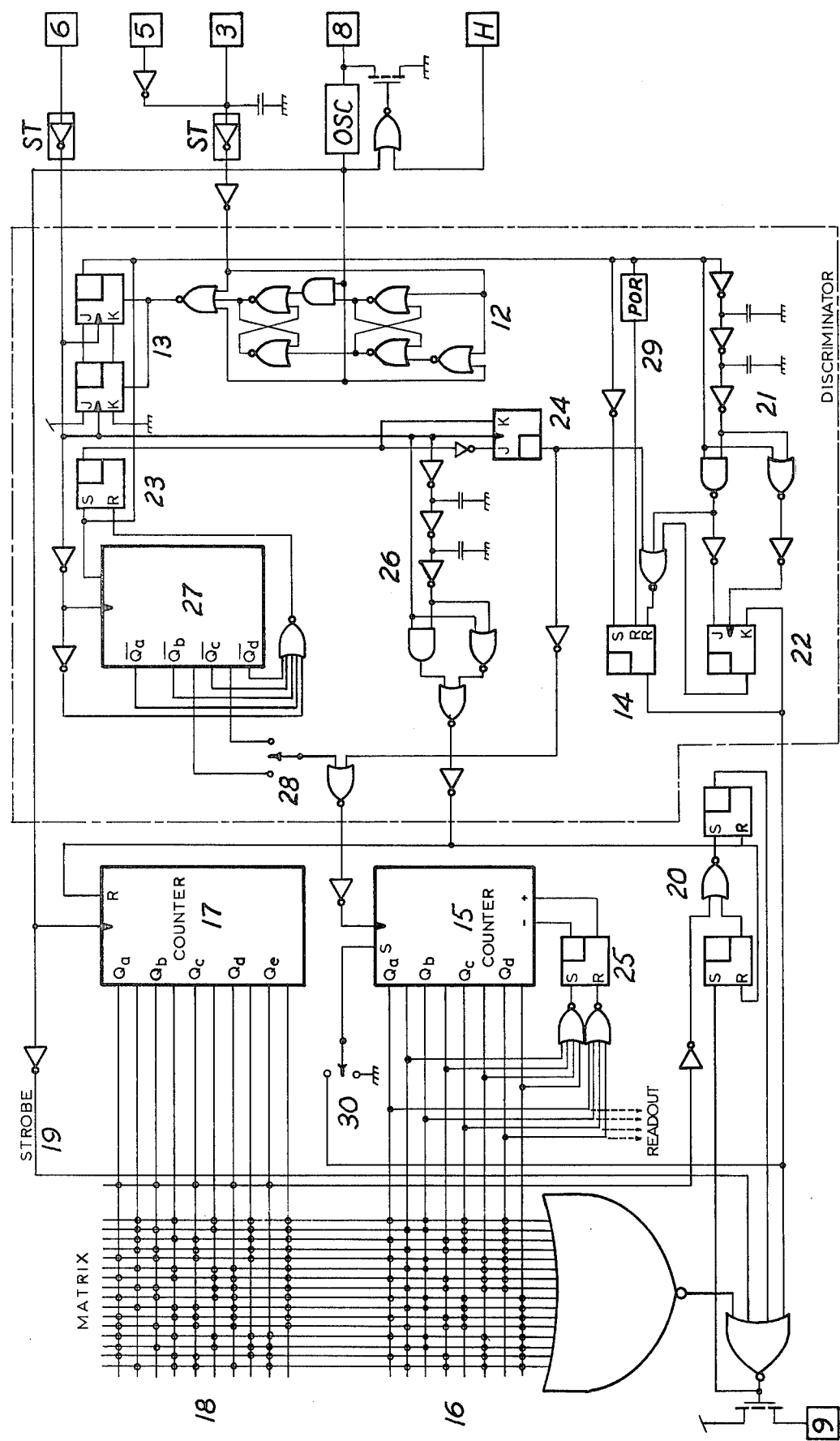
FIG. 2 shows the detailed construction of the circuit represented by the dashed block in FIG. 1. This entire logic block is best fabricated as a single MOS-chip, although TTL, CMOS and other digital integrated-circuit technologies could be used with a resulting sacrifice in compactness.

The touch-control of FIG. 1 is connected to discriminator input 3 of FIG. 2. The discriminator-circuit consisting of items 12,13,14,21,22,23,24,26,27, and 29 measures the duration of the finger-tap and decides on that basis what action the MOS-chip is to take. The digital filter-circuit 12 blocks eventual noise-spikes on input 3 from affecting the dimmer-function. The two JK-flip-flops 13 provide for the alternatives of using either a continuous low (L) signal or a 50/60 Hz alternating line-frequency at input 3, which considerably simplifies the external input circuitry.

Either an L or line-frequency signal at pin 3 effects a change of state of flip-flop 14, which enables the read-out of the matrix 16,18. The state of address-counter 15 determines which one of the columns of the matrix is addressed. Phase-shift-counter 17, which counts at a rate of about 4 kHz, as determined by the oscillator frequency, provides one impulse per matrix-column within each line-voltage half-period according to the decoding at 18. This is the impulse that is used to fire the triac over output pin 9.

The strobe-signal 19 and repetition-inhibitor 20 ensure that only a single, brief, clean trigger-impulse is delivered to the triac each line-voltage half-period. Trigger current is thereby kept to a minimum, easing power-supply requirements for the MOS-chip.

If the duration of the finger-tap on the touch-plate is less than a brief period (the brevity can be step-variably derived from a 50/60 Hz line-voltage period, but for the purposes of this discussion is taken to be 267 msec), circuit 21 delivers an impulse which causes flip-flop 14 to alternately inhibit and enable the MOS-chip output 9, so that the lamp toggles ON and OFF with each finger-tap. But if the duration of the finger-tap is longer than 267 msec, regardless of the initial state of the lamp, the output-inhibit impulse of circuit 21 is itself inhibited by the action of circuit 22, so that the lamp can no longer be switched OFF by removal of the finger from the touchplate. In other words, if the lamp is initially OFF, the subsequent finger-tap, regardless of duration, invariably leaves the lamp ON. However, if the lamp is initially ON, a subsequent brief tap leaves it OFF, but a longer tap maintains the ON-state. (It should be noted in this connection that it is always the leading edge of the finger-tap input-signal that is used to turn the lamp ON and the trailing edge to turn it OFF.)

Assume now that the finger-tap has lasted 267 msec, so that the lamp is ON. If the finger-tap now lasts an additional 283 msec (also arbitrary), flip-flops 23,24 change state so as to enable address-counter 15 to react to clock-impulses derived from the line-frequency by frequency-divider 27, so that one column after the other of the matrix 16,18 is addressed, which leads immediately to change in the lamp brightness according to the decoding configuration at part 18 of the matrix. The output of address-counter 15 can be fed to indicators (such as light-emitting-diodes) so that a digital readout of the brightness is possible. The attachment points for the digital readout are indicated by the dashed lines in FIG. 2. When address-counter 15 reaches a maximum (binary 15), flip-flop 25 is caused to change state so as to initiate a reversal in the counting direction. This reversal occurs as well when the address-counter reaches the minimum value (binary 0). As a result of this action, the brightness of the lamp is stepped gradually in cycles from full brightness to a dimness-level determined by the frequency of oscillator OSC whose frequency is determined by the values of the RC-circuit 7. The maximum brightness can thus be arbitrarily selected. The mode of cycling can be either a gradual bright-dim-bright, a gradual bright-dim with a sudden jump to bright, or a gradual dim-bright with a sudden jump to dim. (The circuit depicted is wired for the first of these alternatives.) In any case the brightness-cycling continues for as long as the finger remains on the touch-plate. Removal of the finger at this point does not result in the lamp's being switched OFF.

The clock frequency for subdividing the line-voltage half-period is determined solely by the setting of the RC-circuit 7, so that the MOS-chip is adaptable to either 50 or 60 Hz applications.

In order to enable the line-voltage half-period to be properly sub-divided by phase-shift-counter 17, it must receive a reset-signal at the zero-crossover point of the line-voltage. This reset-signal is provided by full-differentiator 26, which delivers impulses at the zero-crossover points of the line-voltage-signal which is fed to it over pin 6.

Frequency divider 27 serves to slow down the clock signal applied to address-counter 15. The counting speed is mask-programmable, as represented by switch 28. Frequency divider 27 also establishes the timing of the initial 267 msec interval.

A power-on-reset 29 is included in the circuit to preclude the possibility of otherwise OFF lamps being turned ON at the correction of a power-failure.

The initial brightness-level at switch-on of the lamp is mask-programmable, as represented by switch 30. If S of address-counter 15 is connected to $V_{SS}$, the last-selected brightness-level is put in memory at switch off. If S is connected to $-V_{GG}$, however, the pre-programmed value corresponding to any one of the several available brightness-levels is stored in memory at switch-off, so that the lamp burns initially at that brightness when switched ON again. (A capability of $2^n$ different brightness-levels is conveniently designed into the MOS-chip, necessitating that address-counter 15 have $n$ stages and matrix 16,18 have $2^n$ columns. In the circuits depicted $n=4$.)

The logic blocks ST, OSC and POR represent, respectively, the usual Schmitt-trigger, Oscillator and Power-On-Reset familiar to the competent logic-design engineer.

Figure 3:
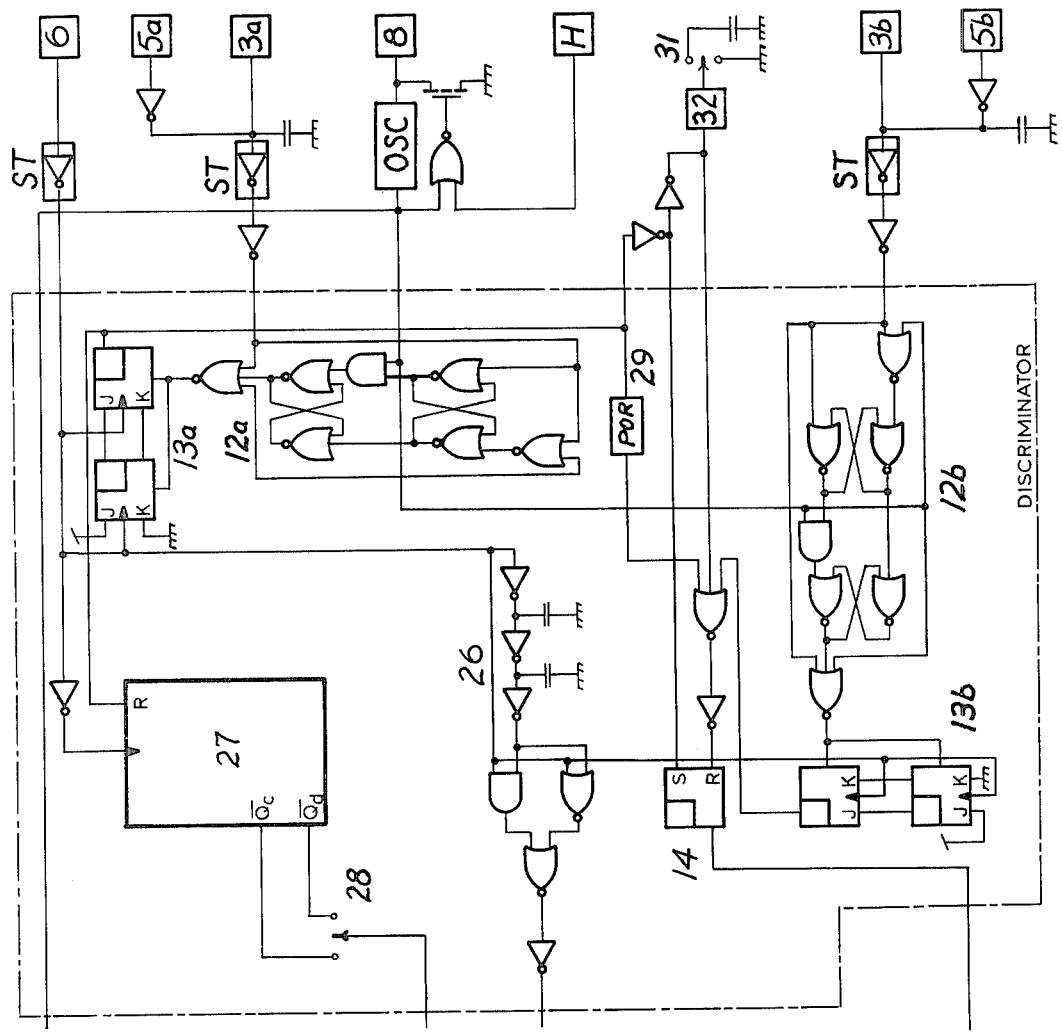
FIG. 3 shows a simplified alternative to the logic of FIG. 2 comprising two inputs responding to two separate identical touch-controls, and a time-delay switch-off feature.

FIG. 3 illustrates a simplified alternative to the logic of FIG. 2. In this particular variation, touch-controls identical to that at input 3 of FIG. 1 are used to activate the inputs 3a and 3b of FIG. 3. The touch-control at input 3a is used to turn the lamp ON and provide the brightness-cycling command, while that at input 3b is used to turn the lamp OFF. The operation of this circuit is very similar to that of the circuit in FIG. 2 but differs as follows:

A brief tap at input 3a will invariably switch the lamp ON. A longer tap will cause the brightness to begin cycling as before. When the finger is removed from the touch-plate, the last selected brightness-level is maintained. A subsequent tap of any duration on the touch-plate of input 3b will turn the lamp OFF. Provision is also made for a time-delay switch-off feature, which can be incorporated in the circuit of FIG. 2 in another form. Activating input 3a causes optional external capacitor 31 to be discharged over input/output 32. Gradual recharging of the capacitor after the input signal is removed eventually causes the lamp to switch-off automatically after a certain period has elapsed. If this feature is not to be used, input/output 32 must be tied to $V_{ss}$.

What is claimed is:

1. An electronic circuit for digital phase-shifted triggering of a triac to vary the amount of power to a load from a line voltage source, comprising:
   (a) signal input means for receiving a plurality of input signals;
   (b) discriminator means for generating on/off and power change signals in response to input signals received;
   (c) oscillator means for providing a subdividing signal having a frequency higher than the line voltage;
   (d) phase shift counter means for generating a plurality of phase shift signals within each half-period of the line voltage in response to the subdividing signal, each of the phase shift signals representing a different potential phase-shifted firing time for the triac within each half periof of the line voltage;
   (e) power level counter means for selecting and storing one of a plurality of power level signals in response to a power change signal generated by said discriminator means; and
   (f) matrix means for evaluating the stored power level signal and the plurality of phase shift signals to determine a firing time for the triac which corresponds to the stored power level signal and for generating a trigger signal for firing the triac at the firing time selected.

2. The electronic circuit according to claim 1, wherein said discriminator means comprises:
   reset means for resetting said phase shift counter means after the passage of a time interval equal to a half-period of the line voltage.

3. The electronic circuit according to claim 2, wherein said reset means comprises:
   zero-crossing reset means for resetting said phase shift counter means at half-period intervals which substantially correspond to the zero voltage levels of the line voltage.

4. The electronic circuit according to claim 1, wherein:
   said discriminator means digitally generates digital power change signals and said phase shift counter means digitally generates digital phase shift signals.

5. The electronic circuit of claim 1, wherein:
   said discriminator means, said oscillator means, phase shift counter means, and said power level counter means are fabricated in MOS integrated circuit technology.

6. The electronic circuit of claim 1, wherein said signal input means receives a plurality of input signals of varying time durations and said discriminator means further comprises:
   (a) first control means for switching said electronic circuit on if off and off if on in response to a first input signal of less than a first time duration;
   (b) second control means which directs the power level counter means to select another power level signal in response to a second input signal of a second time duration whereby the first and second control means interpret the length of the input signal and thereby determine whether said electronic circuit is turned off, turned on, or turned on and the power to the load varied regardless of previous input signals received by the input signal means.

7. The electronic circuit according to claim 6, wherein said discriminator means further compromises:
   inhibit means for inhibiting the operation of said first control means in response to an input signal having a time duration longer than that of the first input signal.

8. The electronic circuit according to claim 7, wherein:
   the second input signal has a longer time duration than the first input signal.

9. The electronic circuit according to claim 7, wherein:
   the leading edge of the first input signal switches said electronic circuit on if off whereas the trailing edge switches said electronic circuit off if on whenever the first input signal is less than or equal to the first time interval.

10. The electronic circuit according to claim 7, wherein:
    the electronic circuit varies the power to a lamp in response to a second input signal of a second time duration whereby the illumination level of the lamp is changed.

11. The electronic circuit according to claim 7, wherein the input signal comprises a signal generated by touching a touch plate and said input signal means comprises:
    touch control means for generating a digital input signal in response to the touch generated signal wherein the time duration of the digital input signal is proportional to the time duration of the touch generated signal.

12. The electronic circuit according to claim 1, wherein said discriminator means comprises:
    digital filtering means which passes the digital input signals derived from an L-signal but prevents the passage of high-frequency noise-spikes.

13. The electronic circuit according to claim 12, wherein:
    said digital filtering means also passes digital input signals derived from 50/60 HZ alternating current line voltage.

14. The electronic circuit according to claim 1, further comprising:
    strobe means for shaping the trigger signal for firing the triac.

15. An electronic circuit for digital phase-shifted triggering of a triac to vary the amount of power to a load from a line voltage source, comprising:
    (a) signal input means for receiving a plurality of input signals of varying time durations;
    (b) discriminator means for interpreting each of said input signals according to the time duration of the input signal, said discriminator means comprising:
        (1) first control means for switching the electronic circuit on if off or off if on in response to an input signal having a time duration less than a specified time interval; and
        (2) second control means for digitally generating a power change signal in response to an input signal having a time duration of greater than the specified time interval;
    (c) digital triggering means for digitally determining a phase-shifted firing time within each half-period of the line voltage in response to the power change signal and for generating a triggering signal for firing the triac at the firing time selected.

16. The electronic circuit according to claim 15, wherein the input signal comprises a signal generated by touching a touch plate and said input signal means compromises:
    touch control means for generating a digital input signal in response to the touch generated signal wherein the time duration of the digital input signal is proportional to the time duration of the touch generated signal.

17. The electronic circuit according to claim 16, wherein said discriminator means further comprises:
    digital filtering means which passes the touch-generated digital input signals derived from an L-signal but prevents the passage of high frequency noise spikes.

18. The electronic circuit according to claim 17, wherein:
    said digital filtering means also passes digital input signals derived from 50/60 HZ alternating current line voltage.

19. The electronic circuit according to claim 15, wherein:
    said discriminator means and said digital triggering means are fabricated in MOS integrated circuit technology.

20. The electronic circuit according to claim 15, wherein:
    the leading edge of an input signal having a time duration less than the specified time interval switches said electronic circuit on if off whereas the trailing edge of the input signal having a time duration less than a specified time interval switches said electronic circuit off if on.

21. The electronic circuit according to claim 15, wherein:
    the electronic circuit varies the power to a lamp in response to an input signal having a time duration of greater than the specified time interval whereby the illumination level of the lamp is changed.

* * * * *